United States Patent
Ou et al.

(10) Patent No.: US 6,828,777 B2
(45) Date of Patent: Dec. 7, 2004

(54) FIXTURE FOR TEST CARDS OF TESTING MACHINE

(75) Inventors: Chun-Nan Ou, Tu-Chen (TW); Tai Ping Zhou, Shenzhen (CN); Lin Yan, Shenzhen (CN); Ga Lei Hu, Shenzhen (CN); Yao Qing Zhao, Shenzhen (CN)

(73) Assignee: Hon Hai Precidion Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/634,569

(22) Filed: Aug. 4, 2003

(65) Prior Publication Data

US 2004/0222784 A1 Nov. 11, 2004

(30) Foreign Application Priority Data

May 7, 2003 (TW) ..................................... 92208368 U

(51) Int. Cl.[7] ........................... G01R 1/04; G01R 31/02
(52) U.S. Cl. .................................... 324/158.1; 324/754
(58) Field of Search ...................... 324/158.1, 754–762; 361/748, 752, 760, 820; 439/69, 74, 77; 257/686, 723

(56) References Cited

U.S. PATENT DOCUMENTS

| | | | | |
|---|---|---|---|---|
| 4,516,072 A | * | 5/1985 | Marpoe, Jr. | 324/754 |
| 4,747,784 A | * | 5/1988 | Cedrone | 324/762 |
| 4,853,626 A | * | 8/1989 | Resler | 324/754 |
| 5,283,605 A | * | 2/1994 | Lang-Dahlke | 324/754 |
| 5,436,570 A | * | 7/1995 | Tan | 324/761 |
| 6,133,745 A | * | 10/2000 | Yoon et al. | 324/755 |
| 6,168,459 B1 | * | 1/2001 | Cox et al. | 439/495 |
| 6,222,739 B1 | * | 4/2001 | Bhakta et al. | 439/69 |
| 6,414,505 B1 | | 7/2002 | Stauff et al. | |
| 6,625,041 B1 | * | 9/2003 | Chen | 361/829 |
| 6,767,252 B2 | * | 7/2004 | McGrath et al. | 439/108 |

FOREIGN PATENT DOCUMENTS

| | | |
|---|---|---|
| TW | 452087 | 10/1999 |
| TW | 491360 | 12/2000 |

* cited by examiner

*Primary Examiner*—David Zarneke
*Assistant Examiner*—Jermele Hollington
(74) *Attorney, Agent, or Firm*—Wei Te Chung

(57) ABSTRACT

A fixture for test cards of testing machine includes an actuator (1), a self-adjusting unit (3), and a testing unit (5). The self-adjusting unit includes a first connecting plate (30) and a second connecting plate (32). The first connecting plate is attached to the actuator. A first through hole (301) is defined in each corner of the first connecting plate. A second through hole (321) is defined in each corner of the second connecting plate. A plurality of coil springs (36) is received in the first and second through holes respectively. A plurality of bolts (34) is extended through the second through holes and the coil springs, and engages in the first through holes respectively. The bolts are movable relative to the second connecting plate. The testing unit is attached to the second connecting plate, and adapted for receiving test cards (90).

20 Claims, 4 Drawing Sheets

FIXTURE FOR TEST CARDS OF TESTING MACHINE

BACKGROUND OF THE INVENTION

1. Field of the Invention

The present invention relates to testing machines for printed circuit boards, and more particularly to fixtures of testing machines for expansion cards.

2. Description of the Related Art

As the computer industry matures, users have come to increasingly demand more powerful and more stable computers. In a typical computer, a plurality of expansion cards is assembled to expansion slot connectors of a motherboard in the computer, for making the computer more powerful. However, computer manufacturers must ensure that the expansion slot connectors in the motherboard are fully functional before releasing the computers into the marketplace. Therefore, a testing machine is needed to test the motherboard's expansion slot connectors. A plurality of testing circuitries is provided in the testing machine for performing such a test.

To test the expansion slot connectors of a motherboard, an operator firstly inserts test cards into the expansion slot connectors of the motherboard one by one, and then actuates the testing machine to test the expansion slot connectors of the motherboard. After the testing machine has finished testing, the operator pulls the test cards from the expansion slot connectors one by one. However, such manual operation is slow, laborious and inefficient. Furthermore, manual operation may damage the test cards and the motherboard, due to inappropriate inserting and/or pulling force being applied. If the operator is inadvertent, the test cards may not be not properly matched with the respective expansion slot connectors, in which case the testing machine will give false results.

To address these problems of manual operation, a number of fixtures for test cards have been devised. Taiwan Patent No. 452087 discloses a fixture for test cards. The fixture comprises a movable board, a fixing base, a pair of bolts, a pair of coil springs, and a correcting plate. The fixing base defines a slot therein. The movable board defines an opening, corresponding to the slot of the fixing base. A longitudinal widened aperture is defined in a bottom of the correcting plate, corresponding to an expansion slot connector of a motherboard to be tested. A longitudinal narrowed hole is defined in a top of the correcting plate, in communication with the aperture. The fixing base is fixed on the movable board. The bolts are extended through the movable board near opposite ends of the fixing base and through the coil springs under the movable board, and are fixedly fastened with the correcting plate. A test card is fastened to the fixing base, and is extended through the slot of the fixing base and the opening of the movable board. In use, the movable board moves toward the motherboard until the aperture of the correcting plate contacts and receives the expansion slot connector therein. The movable board continues moving downwardly, the coil springs are compressed, the correcting plate is blocked by the expansion slot, and the bolts are pushed beyond the movable plate by the blocked correcting plate. The test card is then extended through the hole and the aperture of the correcting plate, and engages in the expansion slot connector.

However, the above fixture does not solve the above-described problem of potential inaccuracy of the test results. The basic requirement for accurate testing is that the movable board, the fixing board, the test card and the correcting plate are properly assembled. This ensures that the extension of the test card through the correcting plate is accurate. However, an overall tolerance of the fixture is liable to change over time, because the fixture sustains repeated impact when used again and again. It is also important that the motherboard is accurately positioned relative to the correcting plate. This ensures that the expansion slot connector of the motherboard is accurately received in the aperture of the correcting plate. However, in practice, it is very difficult to ensure accurate position of the motherboard relative to the correcting plate. When the fixture's tolerance is changed and the motherboard is not accurately positioned, the test card is very prone to be incorrectly engaged in the expansion slot connector of the motherboard. In such case, the test results cannot be relied upon.

SUMMARY OF THE INVENTION

Accordingly, an object of the present invention is to provide a fixture which has an adjusting mechanism for accurately engaging a test card in an expansion slot connector.

Another object of the present invention is to provide a fixture which improves accuracy and reliability of tests performed on expansion slot connectors.

A further object of the present invention is to provide a testing machine incorporating a fixture which has a self-adjusting mechanism.

To achieve the above objects, a fixture in accordance with the present invention comprises an actuator, a self-adjusting unit, and a testing unit. The fixture is received in a testing machine. The self-adjusting unit comprises a first connecting plate and a second connecting plate. The first connecting plate is attached to the actuator. A first through hole is defined in each corner of the first connecting plate. The first through hole comprises a threaded portion and a stepped portion. The stepped portion of the first through hole defines a shoulder therearound. A second through hole is defined in each corner of the second connecting plate, corresponding to the first through hole. The second through hole comprises a shoulder portion, and a tapered portion. The shoulder portion defines a shoulder therearound. A plurality of coil springs is received in the stepped portions of the first through holes and the shoulder portions of the second through holes respectively. Opposite ends of each of the coil springs resiliently abut a corresponding shoulder of the first connecting plate and a corresponding shoulder of the second connecting plate respectively. A plurality of bolts extends through the second through holes of the second connecting plate, and engages in the threaded portions of the first connecting plate respectively. Each of the bolts comprises a head portion, a rod portion, and a threaded end portion. The head portion comprises a tapered surface, corresponding to the tapered portion of a corresponding second through hole of the second connecting plate. The tapered head portion is movably received in the tapered portion of the corresponding second through hole, with the threaded end portion engaging in the threaded portion of a corresponding first through hole. The testing unit is attached to the second connecting plate, and adapted for receiving test cards.

Other objects, advantages and novel features of the present invention will be drawn from the following detailed description of the preferred embodiments of the present invention with the attached drawings, in which:

DESCRIPTION OF THE PREFERRED EMBODIMENTS

Figure 1:
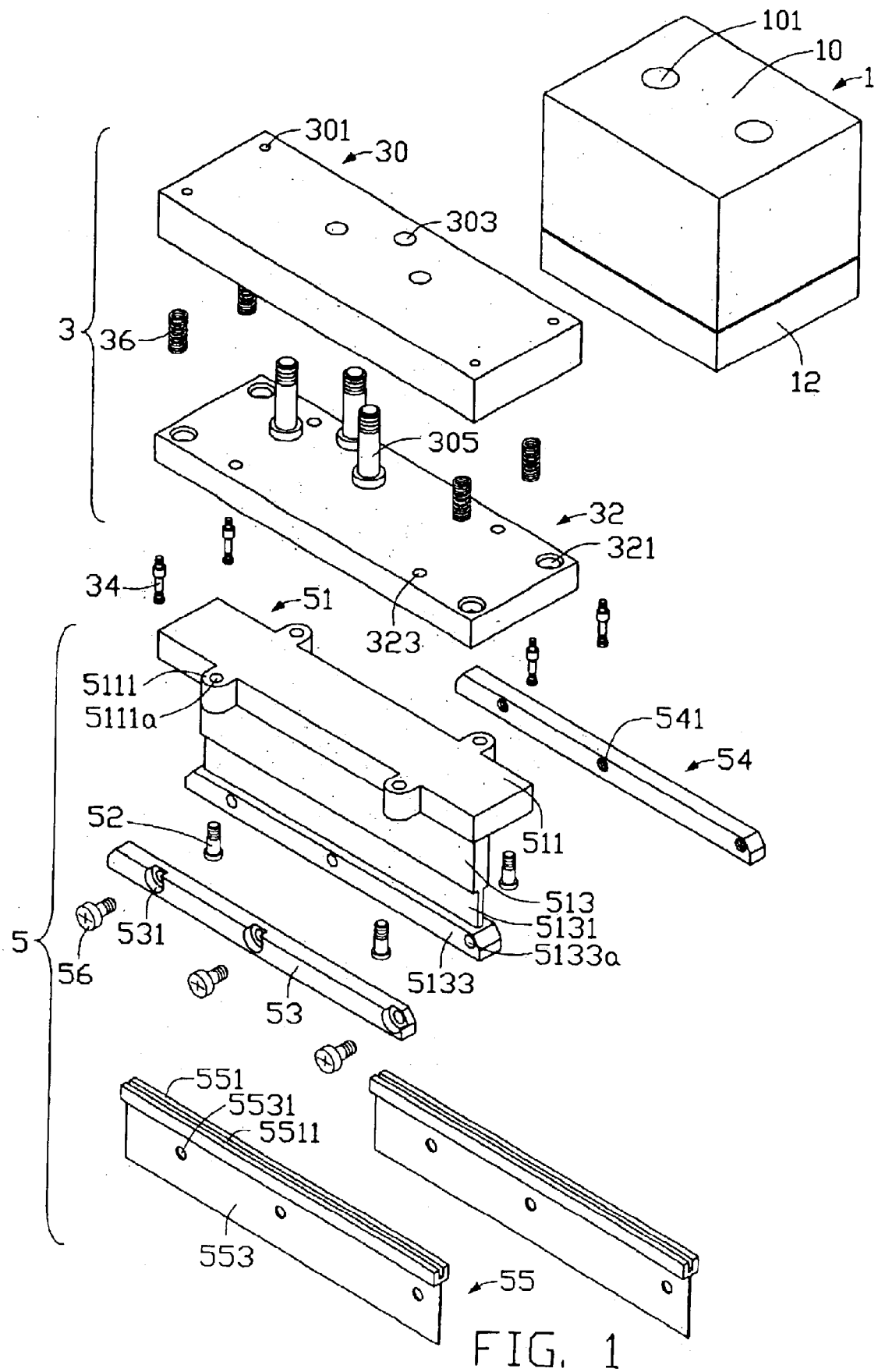
FIG. 1 is an exploded, isometric view of a fixture in accordance with the preferred embodiment of the present invention.
Figure 2:
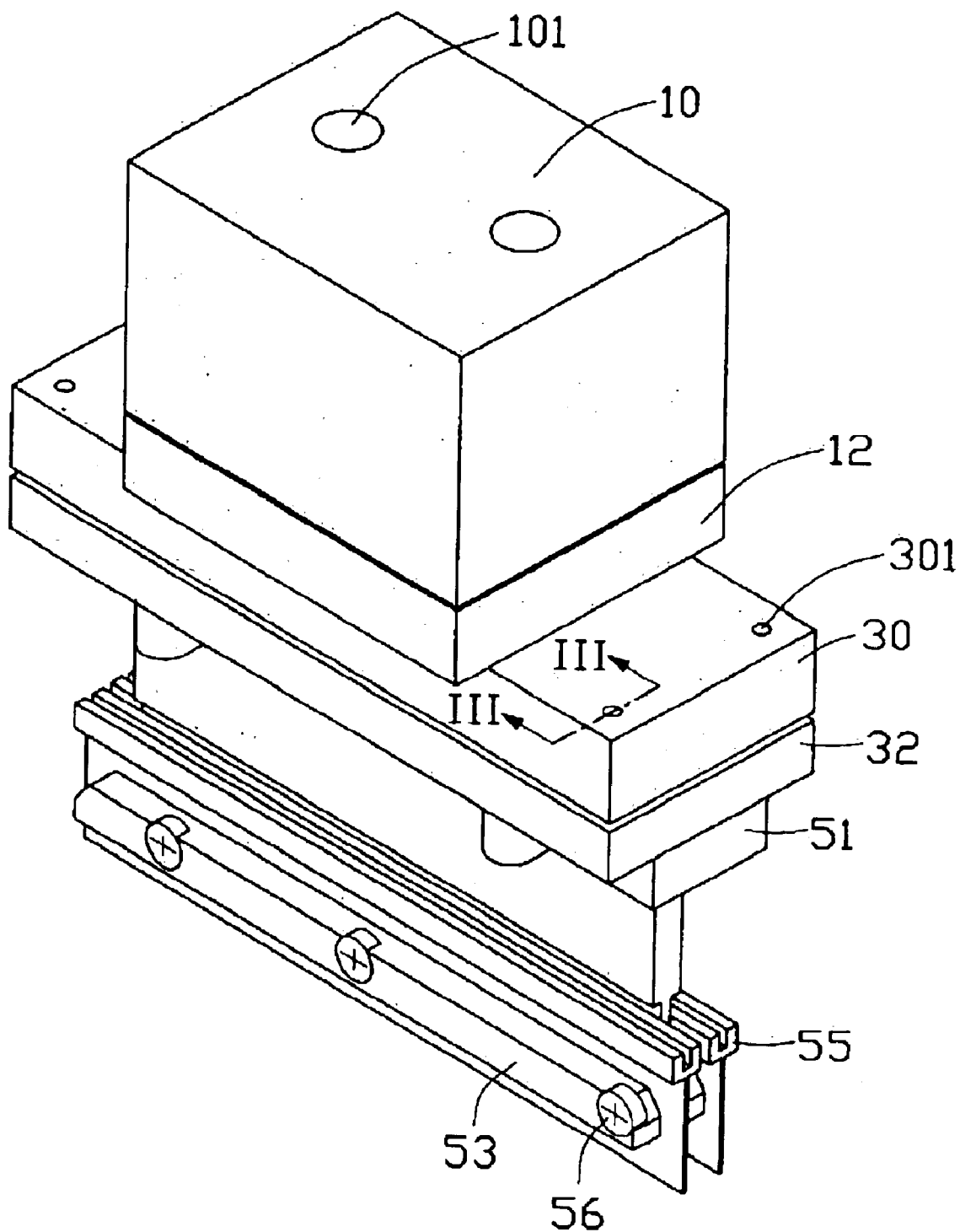
FIG. 2 is an assembled view of FIG. 1.

Referring to FIGS. 1 to 4, a fixture in accordance with the preferred embodiment of the present invention is accommodated in a testing machine for testing a printed circuit board (PCB) 80. The fixture comprises an actuator 1, a self-adjusting unit 3, and a testing unit 5. The PCB 80 may for example be a motherboard.

The testing machine comprises a controller (not shown), a movable board 60, and a base 70. The movable board 60 is movable relative to the base 70. A pair of holes (not labeled) is defined in the movable board 60. The PCB 80 is fixed on the base 70. A pair of expansion slot connectors 81 is provided on the PCB 80. Each expansion slot connector 81 defines a longitudinal slot (not shown) for receiving an expansion card therein. Tapered guiding surfaces of the expansion slot connector 81 surround an entrance to the longitudinal slot.

The actuator 1 is electrically controlled by the controller of the testing machine. The actuator 1 comprises a fixed portion 10, and a movable portion 12. A pair of spaced threaded holes 101 is defined in the fixed portion 10. A pair of screws 63 is extended through the holes of the movable board 60 and engaged in the threaded holes 101, thereby attaching the movable board 60 on the actuator 1.

The self-adjusting unit 3 comprises a first connecting plate 30, a second connecting plate 32, and a plurality of bolts 34 and coil springs 36 for attaching the second connecting plate 32 to the first connecting plate 30.

The first connecting plate 30 is rectangular. A first through hole 301 is defined in each corner of the first connecting plate 30. Each first through hole 301 comprises a top small threaded portion 3011, and a lower large stepped portion 3013. The stepped portion 3013 defines a shoulder 3013a therearound. A plurality of openings 303 is defined in the first connecting plate 30. A plurality of screws 305 is for extending through the openings 303 respectively, in order to attach the first connecting plate 30 to the movable portion 12 of the actuator 1.

The second connecting plate 32 is rectangular. A second through hole 321 is defined in each corner of the second connecting plate 32. The second connecting plate 32 defines a threaded hole 323 near each second through hole 321. Each second through hole 321 comprises a top shoulder portion 3211, a medial tapered portion 3213, and a lower circular portion 3215 all aligned with one another. A shoulder 3211a is defined between the top shoulder portion 3211 and the tapered portion 3213. A tapered surface 3213a is defined surrounding the tapered portion 3213.

Each bolt 34 comprises a head portion 341, a medial stepped rod portion 343, and a threaded end portion 345. The head portion 341 comprises a tapered surface 341a.

In assembly of the self-adjusting unit 3, the coil springs 36 are received in the stepped portions 3013 of the first connecting plate 30 and the shoulder portions 3211 of the second connecting plate 32 respectively. Opposite ends of each coil spring 36 resiliently abut the corresponding shoulder 3013a of the first connecting plate 30 and the corresponding shoulder 3211a of the second connecting plate 32 respectively. The bolts 34 are extended through the second through holes 321 of the second connecting plate 32 and the coil springs 36 and the stepped portions 3013, with threaded end portions 345 of the bolts 34 fixedly engaging in the threaded portions 3011 of the first connecting plate 30 respectively. The tapered surface 341a of each bolt 34 detachably engages with the corresponding tapered surface 3213a of the second connecting plate 32. Once the first and second connecting plates 30, 32 are thus attached together via the bolts 34, a predetermined space is defined between the first and second connecting plates 30, 32.

When no external force is applied to the second connecting plate 32, the combined first and second connecting plates 30, 32 are in a resting position. The tapered surface 341a of each bolt 34 is tightly engaged with the corresponding tapered surface 3213a of the second connecting plate 32, because of decompression forces applied by the corresponding coil spring 36 against the corresponding shoulders 3013a, 3211a. Thus the second connecting plate 32 cannot move in directions transverse to the bolts 34. When external force is applied such that the second connecting plate 32 moves closer to the first connecting plate 30, the coil springs 36 are further compressed, and the tapered surfaces 341a of the bolts 34 disengage from the tapered surfaces 3213a of the second connecting plate 32. The second connecting plate 32 can then move freely in directions transverse to the bolts 34.

The testing unit 5 comprises a bracket 51, a first fixing bar 53, a second fixing bar 54, and a pair of transition cards 55.

The bracket 51 comprises a horizontal plate 511, and a vertical plate 513 depending from the horizontal plate 511. A pair of spaced protrusions 5111 protrudes outwardly from each of opposite sides of the horizontal plate 511. A through opening 5111a is defined in each protrusion 5111, the through openings 5111a corresponding to the threaded holes 323 of the second connecting plate 32. A plurality of screws 52 is extended through the through openings 5111a and engaged in the threaded holes 323 respectively, for fastening the bracket 51 to the second connecting plate 32. The vertical plate 513 comprises a narrowed connecting portion 5131, and a widened fixing portion 5133 depending from the connecting portion 5131. A plurality of apertures 5133a is defined in the fixing portion 5133.

The first fixing bar 53 defines a plurality of countersunk holes 531 therein, corresponding to the apertures 5133a of the bracket 51. The second fixing bar 54 defines a plurality of threaded holes 541 therein, also corresponding to the apertures 5133a of the bracket 51.

Each transition card 55 comprises a top end portion 551, and a printed circuit board 553 depending from the end portion 551. Each end portion 551 defines a longitudinal slot 5511 in a top thereof. A plurality of holes 5531 is defined in the printed circuit board 553, corresponding to the apertures 5133a of the bracket 51. A plurality of screws 56 is provided for attaching the transition cards 55 to opposite sides of the bracket 51.

Figure 3:
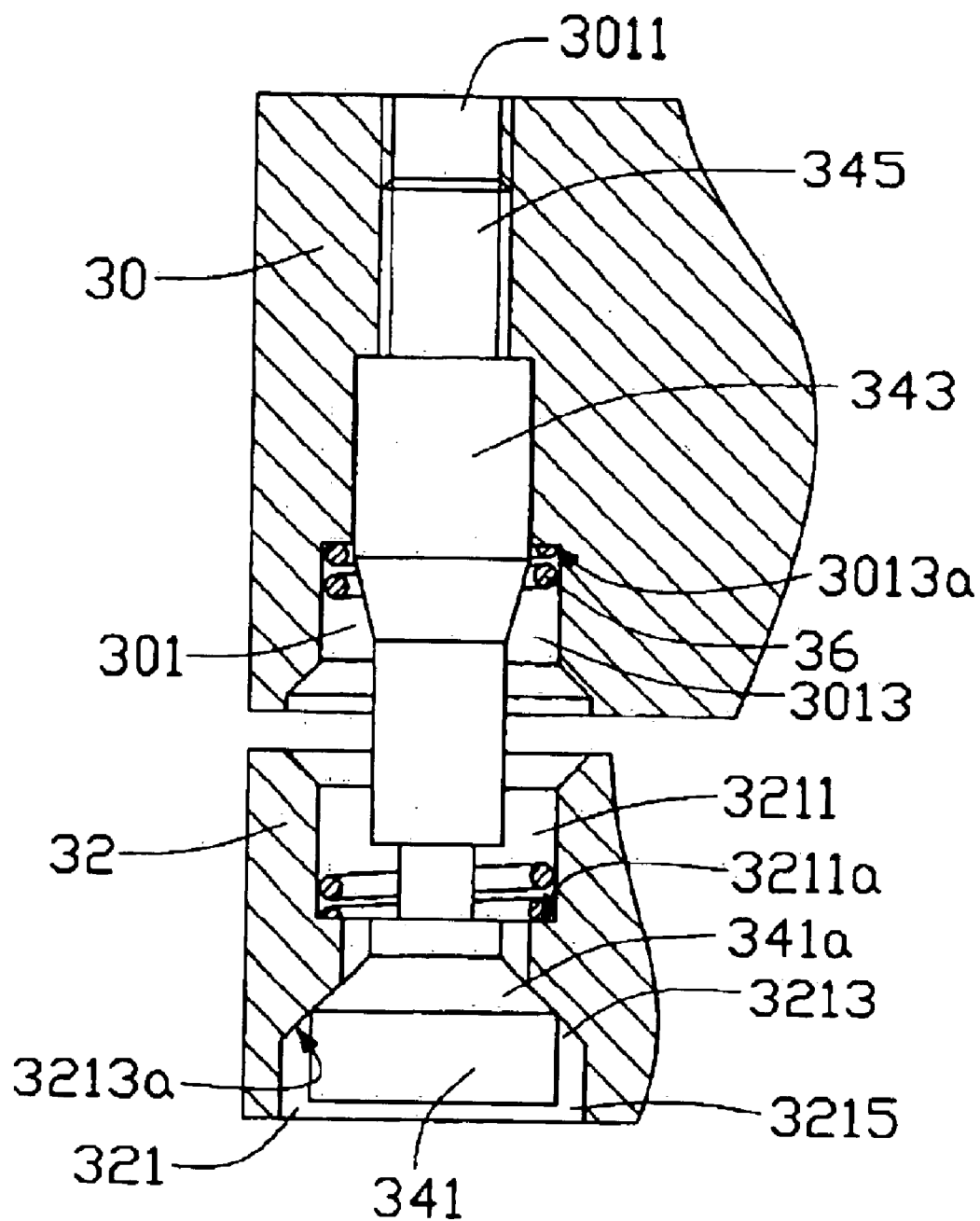
FIG. 3 is a cross-sectional view of part of a self-adjusting unit of the fixture of FIG. 2, taken along line III—III thereof.
Figure 4:
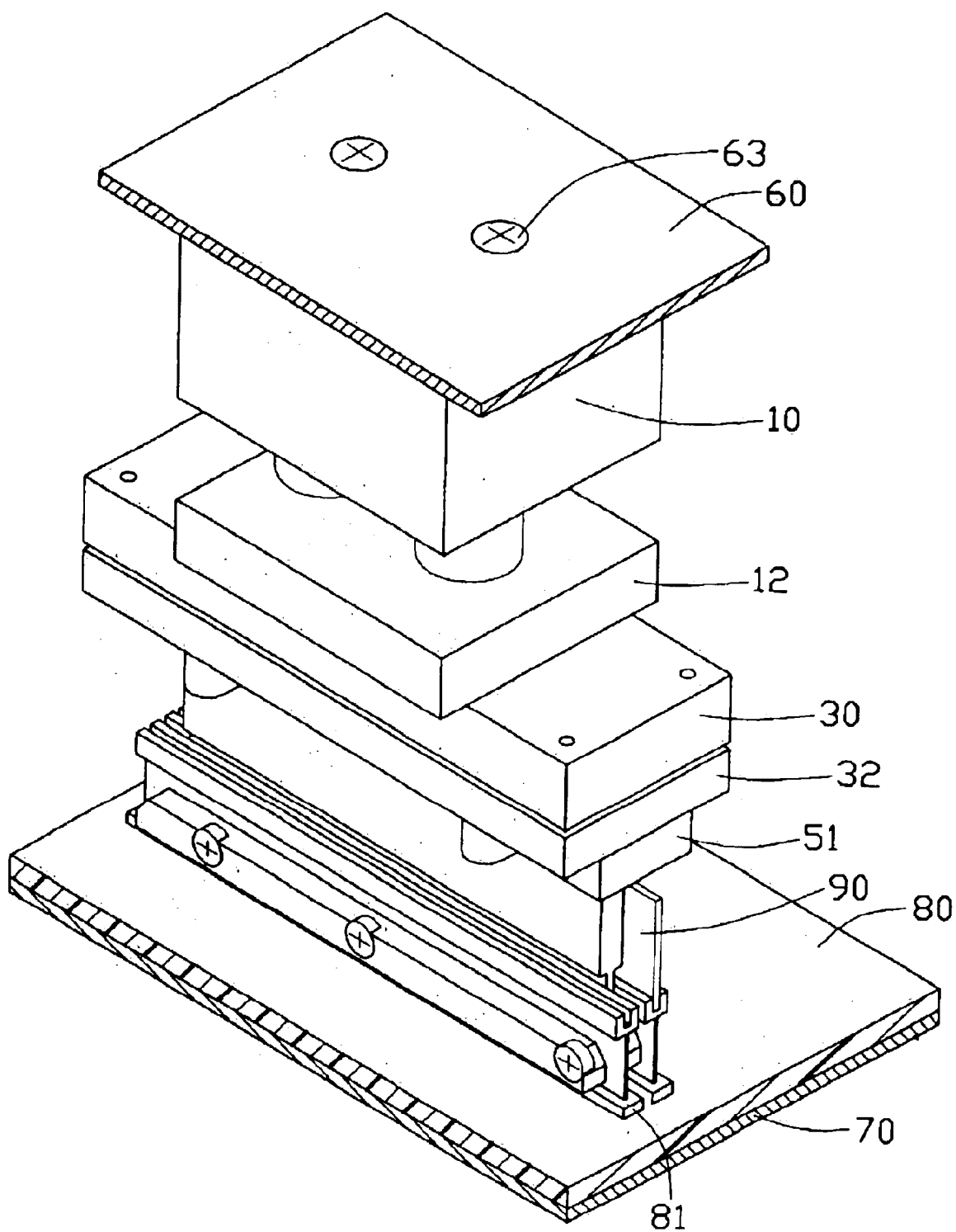
FIG. 4 is an isometric view of the fixture of FIG. 2 assembled with a printed circuit board for testing in a testing machine.

In assembly of the testing unit 5, the first and second fixing bars 53, 54 and the fixing portion 5133 of the bracket 51 are attached together in order to sandwich the transition cards 55 therebetween respectively. The screws 56 are extended through the countersunk holes 531 of the first fixing bar 53, the holes 5531 of the transition cards 55 and the apertures 5531a of the fixing portion 5133, and engaged in the threaded holes 541 of the second fixing bar 54. The end portion 551 of each transition card 55 abuts a corresponding side of the connecting portion 5131 of the bracket 51. A pair of test cards 90 (only one test card 90 is shown in FIG. 3) such as expansion cards is inserted into the slots 5511 of the transition cards 55.

In assembly of the fixture, the actuator 1 is attached to an underside of the movable board 60, the self-adjusting unit 3 is attached to the actuator 1 by the screws 305, and the testing unit 5 is attached to a bottom of the second connecting plate 32 by the screws 52.

In use, firstly, the PCB 80 to be tested is fixed onto the base 70 of the testing machine. Then the testing machine is switched on, and the controller controls the movable board 60 to move a predetermined distance toward the PCB 80. The actuator 1 is thus driven to push the transition cards 55 into the expansion slot connectors 81 of the PCB 80 respectively. If the PCB 80 is not accurately positioned relative to the transition cards 55, the transition cards 55 are blocked by the expansion slot connectors 81 from entering the expansion slot connectors 81. In such case, the actuator 1 still continues driving the first connecting plate 30 downwardly. The second connecting plate 32 remains stationary, and the bolts 34 move downwardly relative to the second connecting plate 32. The coil springs 36 are further compressed, and the tapered surfaces 341a of the bolts 34 are released from the tapered surfaces 3213a of the second connecting plate 32. The second connecting plate 32 is then free to move transversely relative to the bolts 34. The expansion slot connectors 81 apply blocking forces on the transition cards 55, and these forces are translated into transverse forces that cause the second connecting plate 32 to move transversely and accurately position the transition cards 55 relative to the expansion slot connectors 81. Thereupon, the second connecting plate 32 is driven downwardly and pushes the transition cards 55 into secure engagement in the expansion slot connectors 81.

In an alternative embodiment of the present invention, the fixture can be mounted above the movable board 60 by a supporting bracket. In such case, an opening is defined in the movable board 60 for extension of the testing unit 5 therethrough. In a further alternative embodiment of the present invention, the actuator 1 can be omitted. In such case, the first connecting plate 30 is directly attached to the movable board 60. In a still further alternative embodiment of the present invention, the transition cards 55 can be omitted. In such case, the test cards 90 are directly attached to the bracket 51 of the testing unit 5 instead of being attached via the transition cards 55.

While the present invention has been illustrated by the description of preferred embodiments thereof, and while the preferred embodiments have been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A fixture for expansion cards, the fixture comprising:
   a self-adjusting unit comprising a first connecting plate adapted to be attached to a testing machine and a second connecting plate;
   a plurality of springs disposed between the first and second connecting plate;
   a plurality of bolts attaching the second connecting plate to the first connecting plate, the bolts movably engaging with the second connecting plate while fixedly engaging with the first connecting plate; and
   a testing unit adapted to be inserted into expansion slot connectors of a printed circuit board, the testing unit fixedly attached below the second connecting plate for receiving the expansion cards thereon, wherein
   when the first connecting plate is moved relative to the second connecting plate the bolt is disengaged from the second connecting plate such that the testing unit is freed to fit the expansion slot connectors.

2. The fixture as claimed in claim 1, further comprising an actuator adapted to be engaged in the testing machine, and wherein the first connecting plate is attached to the actuator.

3. The fixture as claimed in claim 1, wherein a first hole is defined in each of corners of the first connecting plate, the first hole comprises a threaded portion and a stepped portion, a second hole is defined in each of corners of the second connecting plate corresponding to a respective first hole, the second hole comprises a shoulder portion, a tapered portion, and a circular portion, and the springs are received in the stepped portions of the first holes and the shoulder portions of the second holes respectively.

4. The fixture as claimed in claim 3, wherein each of the bolts comprises a head portion, a rod portion, and a threaded end portion, the head portion comprises a tapered surface, the head portion is movably received in the tapered portion of a corresponding second hole, and the threaded end portion is fixedly engaged in the threaded portion of a corresponding first hole.

5. The fixture as claimed in claim 1, wherein the testing unit comprises a bracket and at least one transition card.

6. The fixture as claimed in claim 5, wherein the bracket of the testing unit comprises a horizontal plate and a vertical plate, the horizontal plate is attached to the second connecting plate, and the vertical plate comprises a connecting portion and a fixing portion.

7. The fixture as claimed in claim 6, wherein the at least one transition card comprises an end portion and a printed circuit board, the end portion defines a slot therein adapted for receiving the test card, and the printed circuit board is fixed to the fixing portion of the bracket of the testing unit.

8. The fixture as claimed in claim 7, wherein the testing unit further comprises a first fixing bar and a second fixing bar, the printed circuit board of the at least one transition card is arranged between the first and second fixing bar and the fixing portion of the bracket, and a plurality of screws is provided to connect the first and second fixing bars.

9. A testing machine for printed circuit boards, comprising:
   a movable board;
   a self-adjusting unit actuated by the movable board, the self-adjusting unit comprising first and second connecting plates, a plurality of resilient members arranged between the first and second connecting plates, and a plurality of bolts movably connecting the first and second connecting plates;
   a base adapted for supporting a printed circuit board thereon;
   a testing unit attached to the second connecting plate of the self-adjusting unit and adapted to insert into expansion slot connectors of the printed circuit board; and
   a controller moving the movable board relative to the base;
   wherein when the controller moves the movable board toward the base, the self-adjusting unit is capable of freely adjusting the position of the second connecting plate with respect to the first connecting plate for ensuring the correct insertion of the testing unit into expansion slot connectors of the printed circuit board.

10. The testing machine as claimed in claim 9, wherein the self-adjusting unit further comprises an actuator fixed to the movable board, the first connecting plate is attached to the actuator, and the controller controls the actuator to move the testing unit for testing the printed circuit board.

11. The testing machine as claimed in claim 10, wherein a plurality of first holes is defined in the first connecting plate, each of the first holes comprises a threaded portion and a stepped portion, the stepped portion defines a shoulder therearound, a plurality of second holes is defined in the second connecting plate corresponding to the first holes, each of the second holes comprises a shoulder portion, a tapered portion, and a circular portion, the shoulder portion defines a shoulder therearound, and opposite ends of each of the resilient members engage with a corresponding shoulder of the first hole and a corresponding shoulder of the second hole respectively.

12. The testing machine as claimed in claim 11, wherein each of the bolts comprises a head portion, a rod portion, and a threaded end portion, the head portion comprises a tapered surface, the head portion is movably received in the tapered portion of a corresponding second hole, and the threaded end portion is fixedly engaged in the threaded portion of a corresponding first hole.

13. The testing machine as claimed in claim 12, wherein the resilient member is a coil spring.

14. The testing machine as claimed in claim 9, wherein the testing unit comprises a bracket and at least one transition card for being inserted into expansion slot connectors of the printed circuit board.

15. The testing machine as claimed in claim 14, wherein the at least one transition card comprises an end portion and a printed circuit board, and the end portion defines a slot therein adapted for receiving a test card.

16. A testing machine assembly comprising:
a printed circuit board having at least one slot connector thereon;
a self-adjusting unit including a first connecting plate and a second connecting plate located below and movable relative to the first connecting plate along a vertical direction;
at least one spring compressibly located between said first connecting plate and said second connecting plate;
at least one bolt including one end fastened to one of said first connecting plate and said second connecting plate, and the other end moveably engaged with the other of said first connecting plate and said second connecting plate;
a testing unit attached to the underside of the second connecting plate and retainably receiving therein a tested card which is electrically connected to said at least slot connector; wherein
said tested card is immoveable relative to the second connecting plate while being moveable relative to the first connecting plate when the spring is deformed from a relaxed manner to a compressed manner.

17. The assembly as claimed in claim 16, wherein said second connecting plate is moveable relative to the first connecting plate in both said vertical direction and other horizontal directions perpendicular to said vertical direction, when said spring is deformed from the relaxed manner to the compressed manner.

18. The assembly as claimed in claim 16, wherein said testing unit includes at least one transition card with one end receiving said tested card and the other end received in said at least slot connector for electrical connecting said test card to the printed circuit board.

19. The assembly as claimed in claim 16, wherein said, at least one spring coaxially surrounds said at least one bolt.

20. The assembly as claimed in claim 16, wherein said one end of the bolt is fastened to the first connecting plate.

* * * * *